US010032786B2

(12) United States Patent
Wu et al.

(10) Patent No.: US 10,032,786 B2
(45) Date of Patent: Jul. 24, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wei Cheng Wu, Zhubei (TW); Jui-Tsung Lien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/267,954

(22) Filed: Sep. 16, 2016

(65) Prior Publication Data

US 2018/0083019 A1   Mar. 22, 2018

(51) Int. Cl.
| H01L 27/11 | (2006.01) |
| H01L 27/115 | (2017.01) |
| H01L 27/11524 | (2017.01) |
| H01L 29/06 | (2006.01) |
| H01L 21/308 | (2006.01) |
| H01L 29/66 | (2006.01) |
| H01L 29/788 | (2006.01) |

(Continued)

(52) U.S. Cl.
CPC .. *H01L 27/11524* (2013.01); *H01L 21/02271* (2013.01); *H01L 21/3081* (2013.01); *H01L 27/11534* (2013.01); *H01L 27/11548* (2013.01); *H01L 29/0649* (2013.01); *H01L 29/66825* (2013.01); *H01L 29/7881* (2013.01)

(58) Field of Classification Search
CPC ......... H01L 27/11524; H01L 27/11534; H01L 27/11548; H01L 21/02271; H01L 21/3081; H01L 29/0649; H01L 29/66825; H01L 29/7881

USPC .................. 257/316, 319; 438/258
See application file for complete search history.

(56) References Cited

U.S. PATENT DOCUMENTS 6,649,471 B2   11/2003   Cho et al.
7,888,729 B2   2/2011   Cheng et al.
(Continued)

OTHER PUBLICATIONS

Office Action German Patent Application No. 10 2016 118 062.9 dated May 15, 2017.

(Continued)

*Primary Examiner* — Cuong Q Nguyen
*Assistant Examiner* — Tong-Ho Kim
(74) *Attorney, Agent, or Firm* — McDermott Will & Emery LLP (57) ABSTRACT

In a method of manufacturing a semiconductor device including a non-volatile memory formed in a memory cell area and a logic circuit formed in a peripheral area, a mask layer is formed over a substrate in the memory cell area and the peripheral area. A resist mask is formed over the peripheral area. The mask layer in the memory cell area is patterned by using the resist mask as an etching mask. The substrate is etched in the memory cell area. After etching the substrate, a memory cell structure in the memory cell area and a gate structure for the logic circuit are formed. A dielectric layer is formed to cover the memory cell structure and the gate structure. A planarization operation is performed on the dielectric layer. An upper portion of the memory cell structure is planarized during the planarization operation.

16 Claims, 11 Drawing Sheets

(51) Int. Cl.
*H01L 21/02* (2006.01)
*H01L 27/11534* (2017.01)
*H01L 27/11548* (2017.01)

(56) References Cited

U.S. PATENT DOCUMENTS

| | | | | |
|---|---|---|---|---|
| 2005/0056885 A1* | 3/2005 | Pai | ............ | H01L 27/105 |
| | | | | 257/330 |
| 2007/0241386 A1* | 10/2007 | Wang | ............ | H01L 27/105 |
| | | | | 257/314 |
| 2015/0263010 A1* | 9/2015 | Chuang | ............ | H01L 29/66545 |
| | | | | 257/319 |
| 2016/0020219 A1* | 1/2016 | Chuang | ............ | H01L 27/11573 |
| | | | | 257/324 |
| 2016/0260728 A1 | 9/2016 | Chen et al. | | |

OTHER PUBLICATIONS

Office Action issued in corresponding Taiwanese Application No. 105138167, dated Oct. 26, 2017.
Office Action issued in corresponding Korean Application No. 10-2016-0147364, dated Jan. 15, 2018.

\* cited by examiner

SEMICONDUCTOR DEVICE AND MANUFACTURING METHOD THEREOF

TECHNICAL FIELD

The disclosure relates to semiconductor integrated circuits, more particularly to semiconductor devices including non-volatile memory cells and peripheral devices, and manufacturing processes thereof.

BACKGROUND

As the semiconductor industry has progressed into nanometer technology process nodes in pursuit of higher device density, higher performance, and lower costs, there have been challenges in controlling flatness of an underlying layer in view of lithography operations. In particular, chemical mechanical polishing operations have played an important role for planarizing the underlying layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A-6C show exemplary cross sectional views illustrating a sequential process for manufacturing a semiconductor device including non-volatile memory cells and peripheral devices according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral devices (e.g., logic circuits). The NVM cells generally require a stacked structure in which plural layers, such as polysilicon layers, are stacked, while the peripheral devices generally include field effect transistors (FETs) having a single polysilicon layer. Because of the structure differences, when, for example, an interlayer dielectric (ILD) layer is formed over the NVM cells and the peripheral devices, there is a height difference in the ILD layer between an NVM cell area and a peripheral device area. Such a height difference may affect the performance of CMP on the ILD layer.

In the present disclosure, before fabricating the NVM cells and the peripheral devices, a substrate in the NVM cell area is etched to make a "step" between the NVM cell area and the peripheral device area. The step height corresponds to the height difference when the ILD layer is formed if the step is otherwise not formed. Further, it is also noted that placement of devices should be avoided near the step.

Figure 1A:
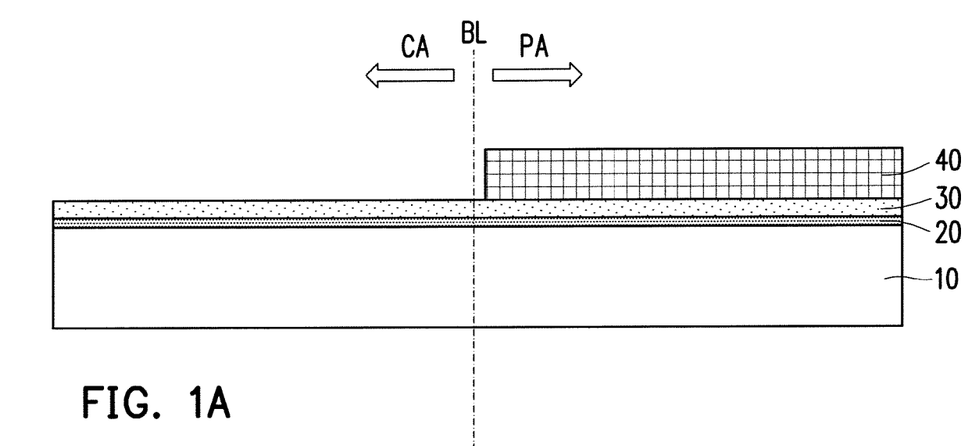
FIGS. 1A and 1B show exemplary cross sectional views illustrating a sequential process for manufacturing a semiconductor device including non-volatile memory cells and peripheral devices according to one embodiment of the present disclosure.
Figure 1B:
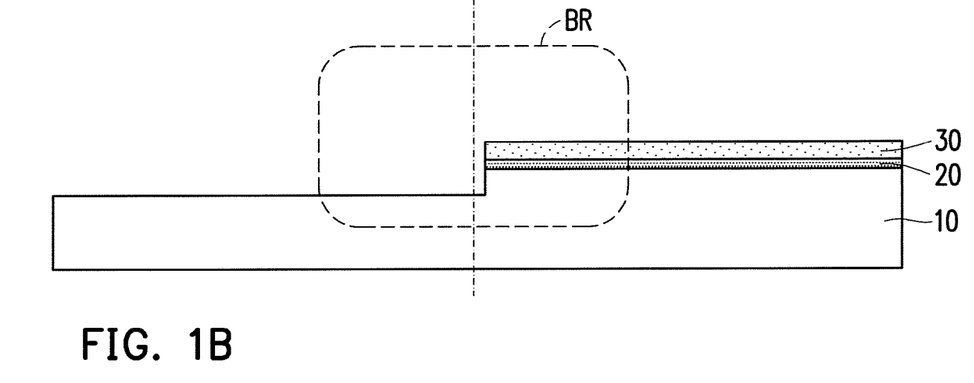

FIGS. 1A and 1B show exemplary cross sectional views illustrating a sequential process for manufacturing a semiconductor device including non-volatile memory cells and peripheral devices according to one embodiment of the present disclosure. It is understood that additional operations can be provided before, during, and after processes shown by FIGS. 1A and 1B, and some of the operations described below can be replaced or eliminated, for additional embodiments of the method.

As shown in FIG. 1A, a pad oxide layer 20 is formed on the substrate 10 and a nitride layer 30 is further formed on the pad oxide layer 20. A photo resist pattern 40 is formed by a lithography operation so as to cover the peripheral area PA. In one embodiment, the substrate 10 is silicon, the pad oxide layer 20 is thermally grown silicon oxide, and the nitride layer 30 is silicon nitride. The silicon oxide and the silicon nitride can be formed by using furnace or chemical vapor deposition (CVD). The substrate 10 may be SiGe, SiC, or a group III-V semiconductor. The thickness of the pad oxide layer 20 is in a range from about 5 nm to about 20 nm and the thickness of the nitride layer 30 is in a range from about 50 nm to about 100 nm in some embodiments.

By using the resist mask 40 as an etching mask, the pad oxide layer 20 and the nitride layer 30 are etched and further the substrate 10 in the NVM cell area CA is etched, as shown in FIG. 1B.

In some embodiments, the pad oxide layer 20 and the nitride layer 30 are etched by using the resist mask 40 as an etching mask, the resist mask 40 is removed, and then the substrate 10 is etched by using the patterned pad oxide layer 20 and the nitride layer 30. In other embodiments, the substrate 10 is etched by using the resist mask 40 as an etching mask together with the pad oxide layer 20 and the nitride layer 30.

FIGS. 2A-2D show exemplary cross sectional views illustrating a sequential method for manufacturing a semiconductor device including non-volatile memory cells and peripheral devices according to one embodiment of the present disclosure. FIGS. 2A-2D show an enlarged view of a boundary region BR around a boundary line BL of the cell area CA and the peripheral area PA (see, FIGS. 1A and 1B). It is understood that additional operations can be provided before, during, and after the operations shown by FIGS. 2A-2D, and some of the operations described below can be replaced or eliminated, for additional embodiments of the method.

Figure 2A:
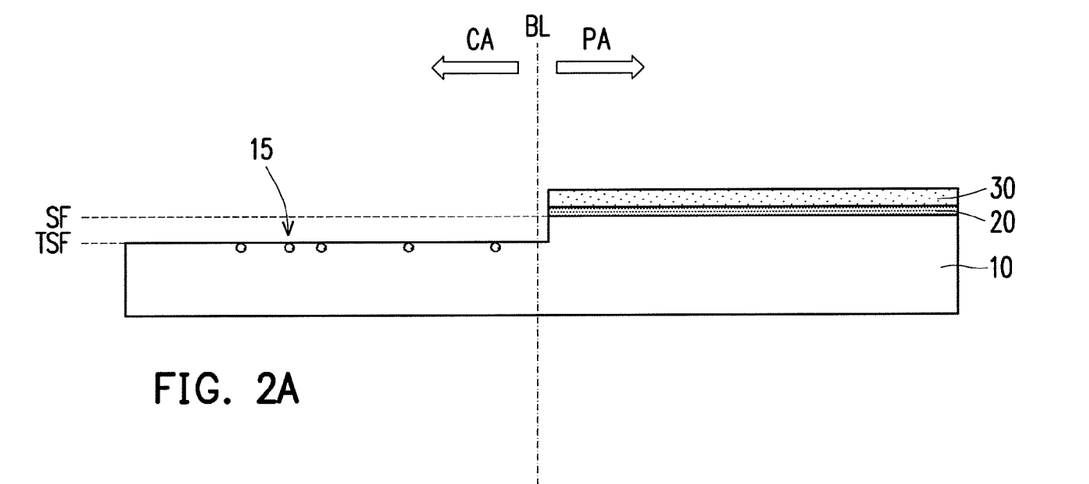
FIGS. 2A-2D show exemplary cross sectional views illustrating a sequential process for manufacturing a semiconductor device including non-volatile memory cells and peripheral devices according to one embodiment of the present disclosure.

As shown in FIG. 2A, by using the patterned pad oxide layer 20 and the nitride layer 30 as an etching mask, the substrate 10 is etched to a target surface TSF so as to form the step. The height of the step, i.e., a difference between the original surface (the interface between the pad oxide layer 20 and the substrate 10) SF and the target surface TSF is in a range from about 10 nm to about 100 nm in some embodiments, and is in a range from about 20 nm to about 50 nm in other embodiments. In this disclosure, the surface SF may be referred to as a device forming surface in the NVM cell area CA and the target surface TSF may be referred to as a device forming surface in the peripheral area PA. As shown in FIG. 2A, the etching may damage the etched target surface, creating damaged portions 15 in or at the etched target surface.

Figure 2B:
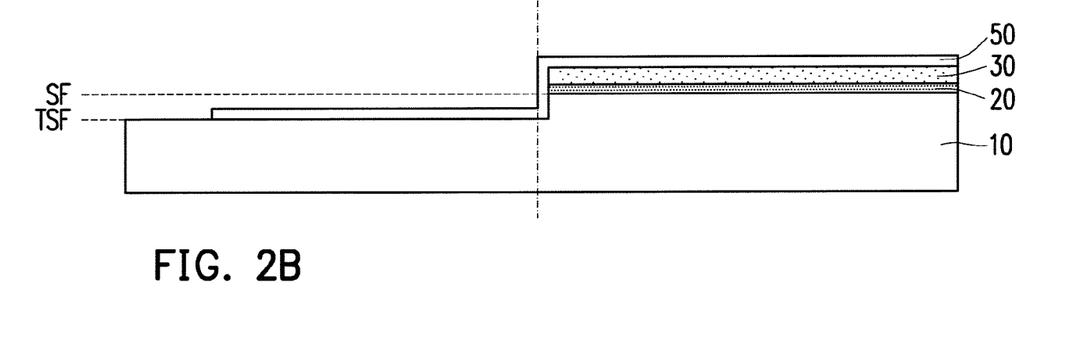

After the substrate 10 is etched, a silicon oxide layer 50 is formed on the etched surface, as shown in FIG. 2B. The silicon oxide layer 50 is formed by CVD, such as low pressure CVD and plasma CVD. The thickness of the silicon oxide layer 50 is in a range from about 0.5 nm to about 5 nm in some embodiments, and is in a range from about 1 nm to about 3 nm in other embodiments. The silicon oxide layer 50 may be formed over the nitride layer 30.

In certain embodiments, the silicon oxide layer 50 can be other silicon oxide-based layers, such as a SiON layer, a SiOC layer and a SiOCN layer.

In certain embodiments, instead of CVD, a rapid thermal oxidation can be employed to slightly oxidize the etched surface in the cell area CA.

Figure 2C:
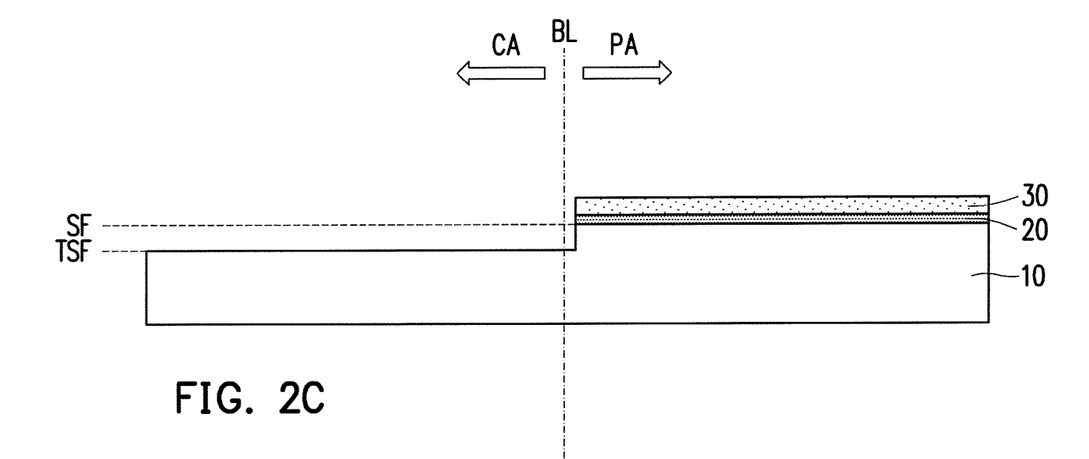
Figure 2D:
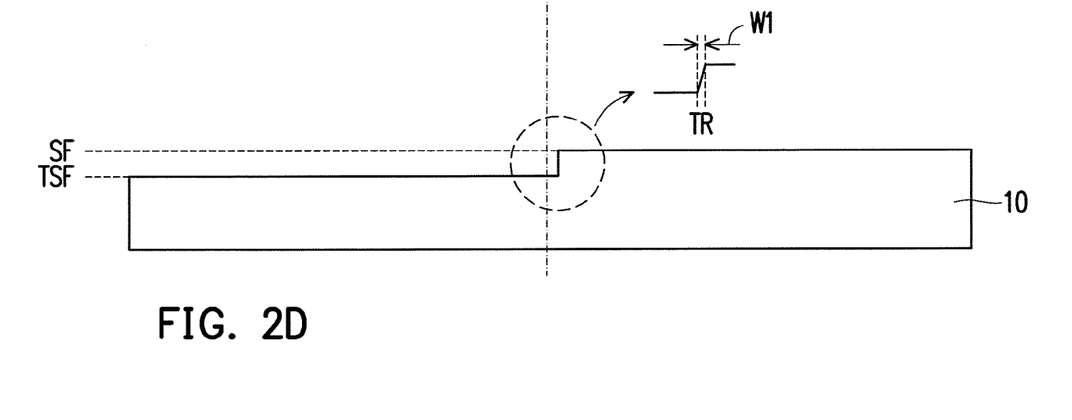

Subsequently, as shown in FIG. 2C, the silicon oxide layer 50 is removed by wet etching, thereby removing the damaged portions 15, and further the pad oxide layer 20 and the nitride layer 30 are removed by etching operations such as dry etching or wet etching, as shown in FIG. 2D.

As shown in FIG. 2D, the surface TSF in the cell area CA, on which the NVM cells are formed (the device forming surface in the cell area), is located at a lower level than the surface SF in the peripheral area PA, on which the logic circuits are formed (the device forming surface of the peripheral area). In this disclosure, the "level" is defined in the normal direction of the substrate and the level becomes higher as the distance from the substrate increases. The level may be measured from the backside surface of the substrate.

As shown in FIG. 2D, the cell area having the surface TSF and the peripheral area PA having the surface SF is connected by a transition surface TR in which a level of a surface of the substrate changes. The width W1 of the transition surface TR is in a range from about 0 nm to about 100 nm in some embodiments, and is in a range from about 1 nm to about 10 nm in other embodiments.

FIGS. 3A-3D show exemplary cross sectional views illustrating a sequential method for manufacturing a semiconductor device including non-volatile memory cells and peripheral devices according to one embodiment of the present disclosure. FIGS. 3A-3D show an enlarged view of the boundary region BR (see, FIGS. 1A and 1B). It is understood that additional operations can be provided before, during, and after the operations shown by FIGS. 3A-3D, and some of the operations described below can be replaced or eliminated, for additional embodiments of the method.

Figure 3A:
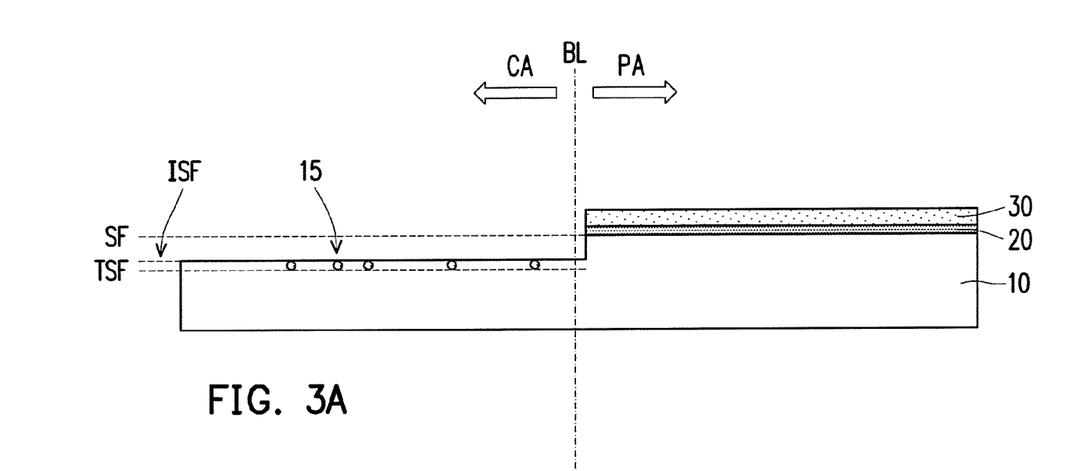
FIGS. 3A-3D show exemplary cross sectional views illustrating a sequential processes for manufacturing a semiconductor device including non-volatile memory cells and peripheral devices according to another embodiment of the present disclosure.

As shown in FIG. 3A, by using the patterned pad oxide layer 20 and the nitride layer 30 as an etching mask, the substrate 10 is etched to an intermediate surface ISF so as to form an initial step. The intermediate surface ISF is located at a level between the original surface SF and the target surface TSF. The height of the initial step, i.e., a difference between the original surface SF and the intermediate surface ISF is in a range from about 5 nm to about 50 nm in some embodiments, and is in a range from about 10 nm to about 30 nm in other embodiments. As shown in FIG. 3A, the etching may damage the etched target surface, creating the damaged portions 15 in or at the etched target surface.

Figure 3B:
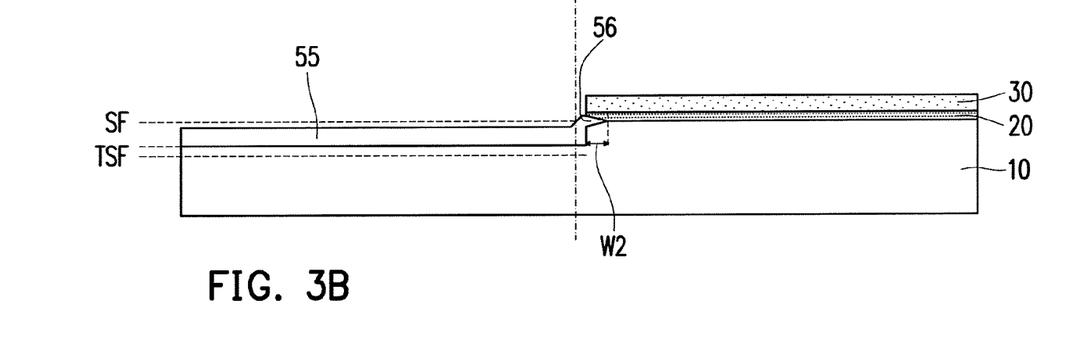

After the substrate 10 is etched, a silicon oxide layer 55 is formed by a thermal oxidation, as shown in FIG. 3B. In one embodiment, the thermal oxidation is wet oxidation using steam. The thickness of the silicon oxide layer 55 is adjusted such that the bottom of the silicon oxide layer 55 is substantially at the target surface. In some embodiments, the thickness of the silicon oxide layer 55 is in a range from about 5 nm to about 50 nm in some embodiments, and is in a range from about 10 nm to about 20 nm in other embodiments.

As shown in FIG. 3B, a bird's beak 56 is formed under the nitride layer 30. The width W2 of the bird's beak under the nitride layer 30 is in a range from about 50 nm to about 500 nm in some embodiments.

Figure 3C:
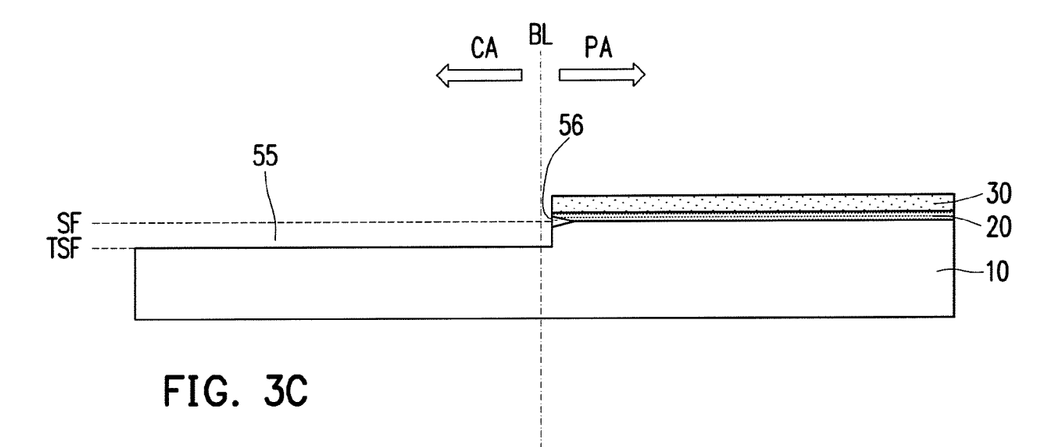
Figure 3D:
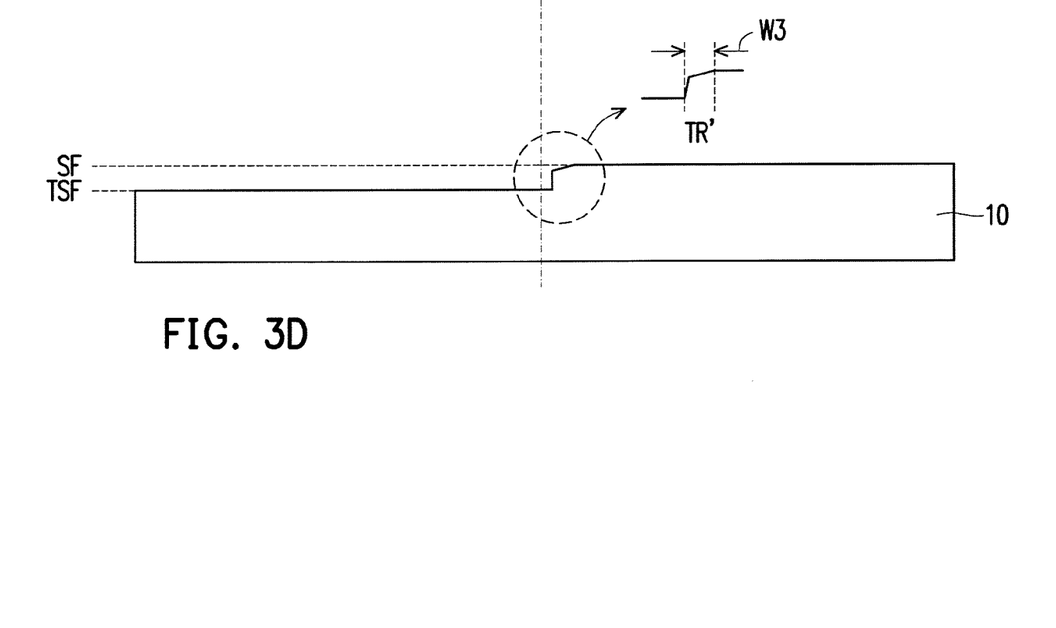

Subsequently, as shown in FIG. 3C, the silicon oxide layer 55 is removed by wet etching, thereby removing the damaged portions 15, and further the pad oxide layer 20, bird's beak 56, and the nitride layer 30 are removed by suitable etching operations, as shown in FIG. 3D.

As shown in FIG. 3D, the surface TSF in the cell area CA, on which the NVM cells are formed (the device forming surface in the cell area), is located at a lower level than the surface SF in the peripheral area PA, on which the logic circuits are formed (the device forming surface of the peripheral area).

As shown in FIG. 3D, the cell area having the surface TSF and the peripheral area PA having the surface SF is connected by a transition surface TR' in which a level of a surface of the substrate changes. The width W3 of the transition surface TR' is in a range from about 5 nm to about 500 nm in some embodiments, and is in a range from about 10 nm to about 250 nm in other embodiments.

As shown in FIG. 3D, the transition surface TR' may include two surfaces, one of which corresponds to the bird's beak and the other one of which corresponds to the etched surface in the substrate etching shown in FIG. 3A. In some embodiments, the surface corresponding to the bird's beak is wider than the surface corresponding to the etched surface. In one embodiment, the width of the surface corresponding to the etched surface is in a range from about 1 nm to about 100 nm.

After the "step" is formed as shown in FIG. 2D or FIG. 3D, the NVM cells in the cell area CA and the gate structures for the logic circuits in the peripheral area PA are fabricated.

FIGS. 4A-6C show exemplary cross sectional views illustrating a sequential process for manufacturing a semiconductor device including non-volatile memory cells and peripheral devices according to one embodiment of the present disclosure. It is understood that additional operations may be provided before, during, and after processes shown by FIGS. 4A-6C, and some of the operations described below can be replaced or eliminated for additional embodiments of the method. The order of the operations/processes may be interchangeable.

The fabrication operations of the non-volatile memory cells may be described in U.S. patent application Ser. No. 15/209,370, and the entire contents of which are incorporated herein by reference.

After the "step" is formed, isolation insulating layers 400, which are also called shallow trench isolation (STI), are formed. To form the isolation insulating layer 400, a mask layer including a silicon oxide layer and a silicon nitride layer is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 μm in some embodiments.

Figure 4A:
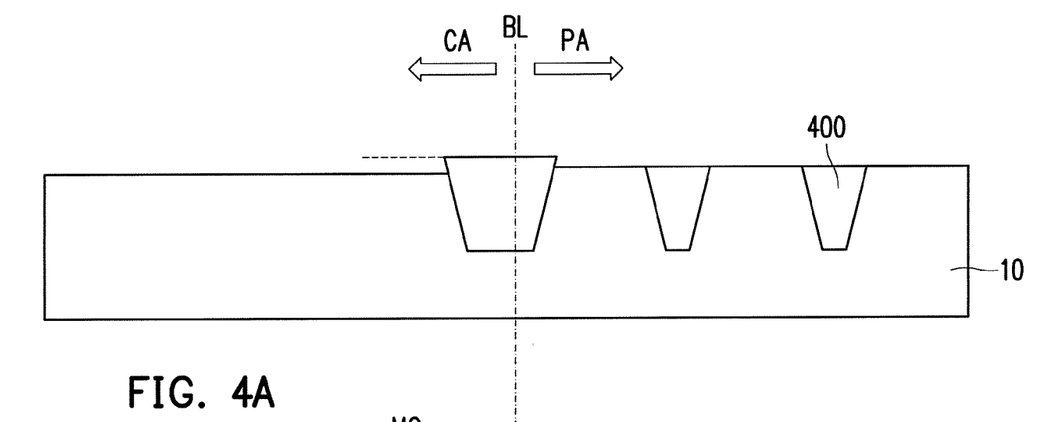

The trenches are filled with an insulating (dielectric) material, and then, a planarization operation, such as CMP or an etch-back process, is performed so as to remove an upper part of the insulating material layer, thereby forming the isolation layers 400. The substrate not etched, and surrounded or separated by the STI in plan view is an active region, over which transistors or other semiconductor devices are formed. As shown in FIG. 4A, the cell area CA and the peripheral area PA may be separated by the isolation layer 400. Of course, after the isolation layers 400 are formed, the "step" between the cell area and the peripheral area is maintained.

Figure 4B:
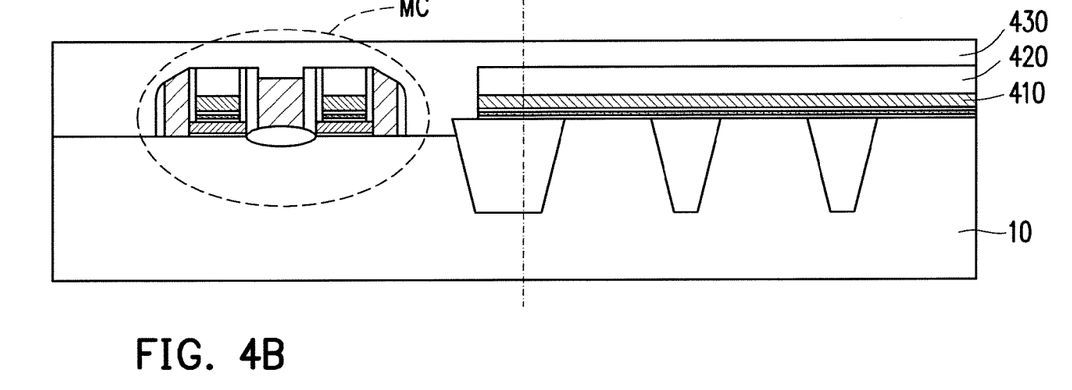

After the isolation layers 400 are formed, the NVM cell structures MC are formed in the cell area CA, as shown in FIG. 4B.

Figures 5A, 5B:
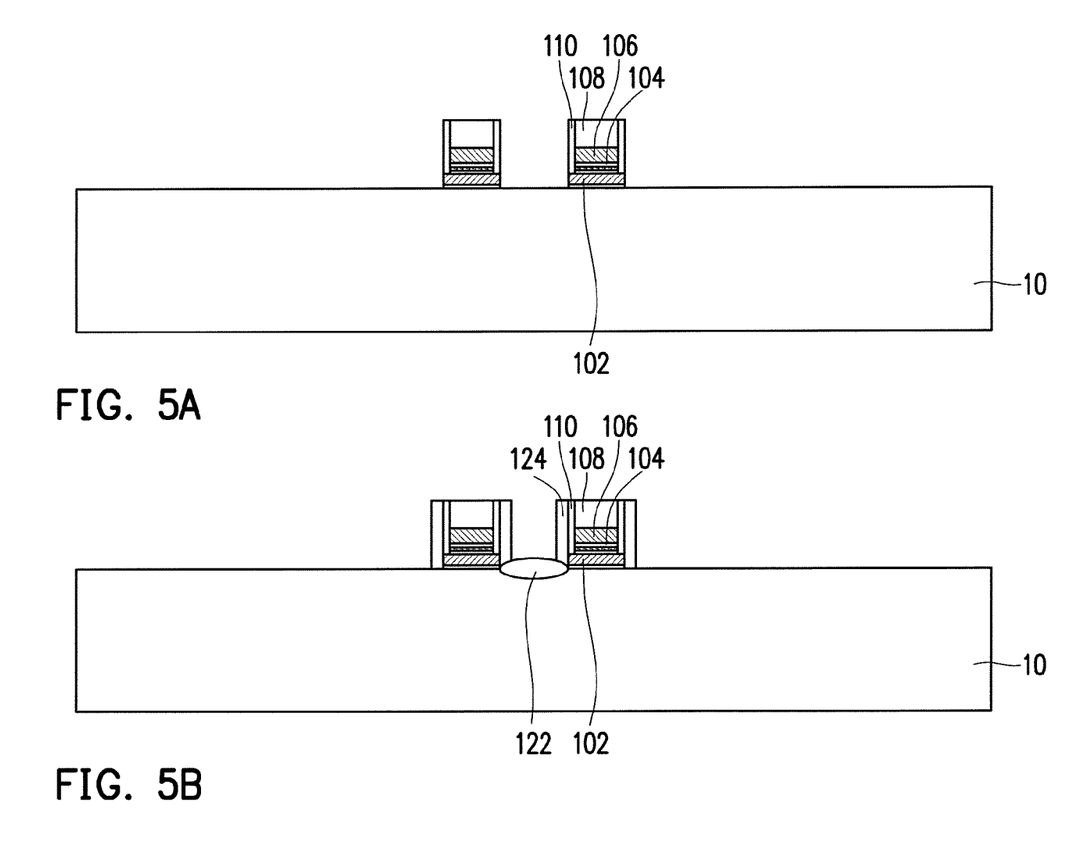
Figure 5C:
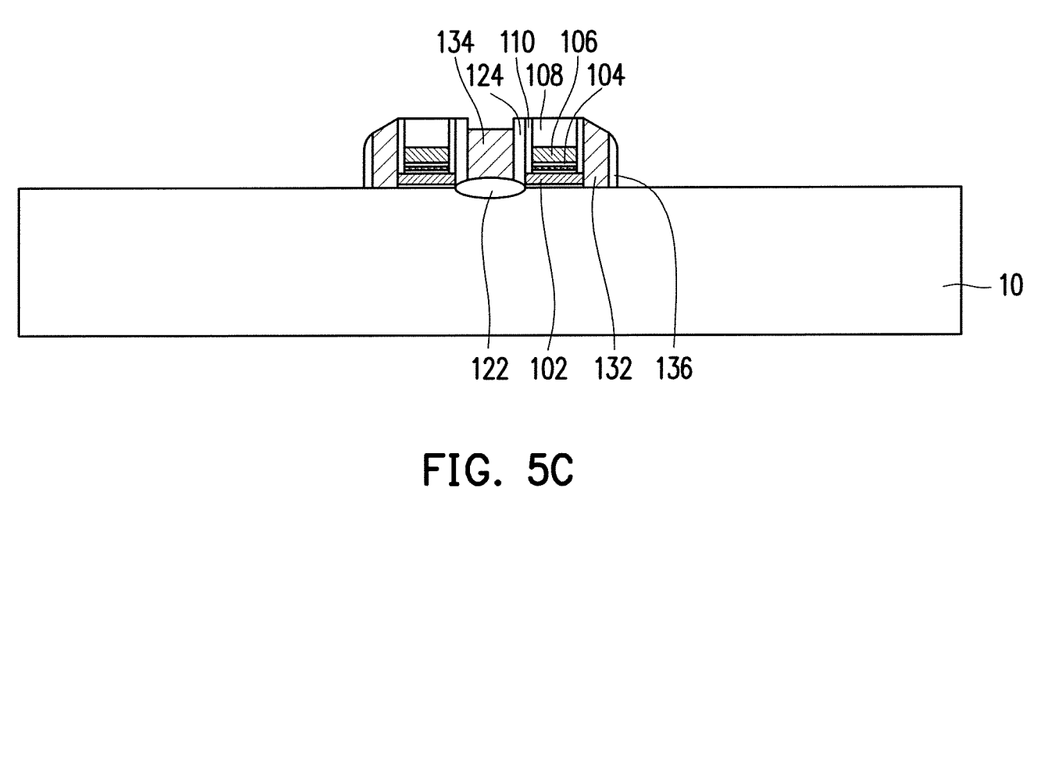

FIGS. 5A-5C show exemplary cross sectional views illustrating a sequential process for manufacturing an NVM cell structure MC according to one embodiment of the present disclosure.

A first polysilicon layer is formed over the substrate and patterned by suitable patterning operations, thereby forming floating gate patterns (FG patterns) 102. A width of the FG pattern 102 is in a range from about 80 nm to about 120 nm and a thickness of the FG pattern 102 is in a range from about 20 nm to about 70 nm, in some embodiments.

After the FG pattern 102 is formed, a stacked layer of a first insulating layer stack 104, a second polysilicon layer 106 and a second insulating layer 108 are formed over the FG pattern 102. The first insulating layer stack 104 includes a silicon oxide-silicon nitride-silicon oxide (ONO) structure, having thicknesses of about 30-50 nm, about 70-90 nm and about 30-50 nm, respectively, in some embodiments. The thickness of the second polysilicon layer 106 is in a range from about 45 nm to about 70 nm, in some embodiments.

The second insulating layer 108 is silicon nitride having a thickness of about 50 nm to about 200 nm in some embodiments. In certain embodiments, the second insulating layer has a stacked structure of a silicon nitride layer having a thickness of about 5 nm to about 10 nm, a silicon oxide layer having a thickness of about 50 nm to about 100 nm, and a silicon nitride layer having a thickness of about 400 nm to about 1000 nm, in some embodiments. These layers can be formed by CVD.

Subsequently, the stacked layer is patterned in some embodiments by using lithography and etching operations, thereby forming a gate stack structure including an ONO layer 104, a control gate (CG) 106 and a nitride cap 108, as shown in FIG. 5A Further, first sidewall spacers (CG spacers) 110 are formed on both main side faces of the stacked gate structure, as shown in FIG. 5A. The first sidewall spacers 110 are made of, for example, one or more layers of SiN, $SiO_2$ and SiON, and have a thickness in a range from about 10 nm to about 40 nm in some embodiments.

Further, an oxide layer 122 is formed between two gate structures, and second sidewall spacers (FG spacers) 124 made of silicon oxide are formed as shown in FIG. 5B. The second sidewall spacers 124 are made of, for example, one or more layers of SiN, $SiO_2$ and SiON, which may be the same or different from the first sidewall spacers 110, and have a thickness in a range from about 10 nm to about 40 nm in some embodiments.

Subsequently, word lines 132 and an erase gate line 134 are formed as shown in FIG. 5C. The word lines 136 and erase gate line 134 are made of a conductive material, such as doped polysilicon. A thickness of the word lines 132 and erase gate line 134 is in a range from about 50 nm to about 140 nm in some embodiments. Further, third sidewall spaces (WL spacers) 136 are formed on sidewalls of the word lines 132, as shown in FIG. 5C.

Back to FIG. 4B, in the peripheral area PA, a polysilicon layer 410 and a silicon nitride layer 420 are formed. In some embodiments, the polysilicon layer 410 is formed at the same time as the second polysilicon layer 106 for the CG pattern, and the silicon nitride layer 420 is formed at the same time as second insulating layer 108. In some embodiments, one or more other polysilicon layers and/or dielectric layers (silicon oxide or silicon nitride) are formed in the peripheral area PA when such polysilicon layers and/or dielectric layers are formed in the cell area CA.

After the NVM cell structure MC is formed, a cover layer 430 is formed over the NVM cell structure MC in the cell area CA and over the silicon nitride layer 420 in the peripheral area PA, as shown in FIG. 4B. The cover layer 430 is made of polysilicon in some embodiments. Before forming the polysilicon cover layer 430, a dielectric layer, such as a silicon oxide layer, is formed over the NVM cell structure MC in the cell area CA and over the silicon nitride layer 420 in the peripheral area PA, by using CVD.

Figure 4C:
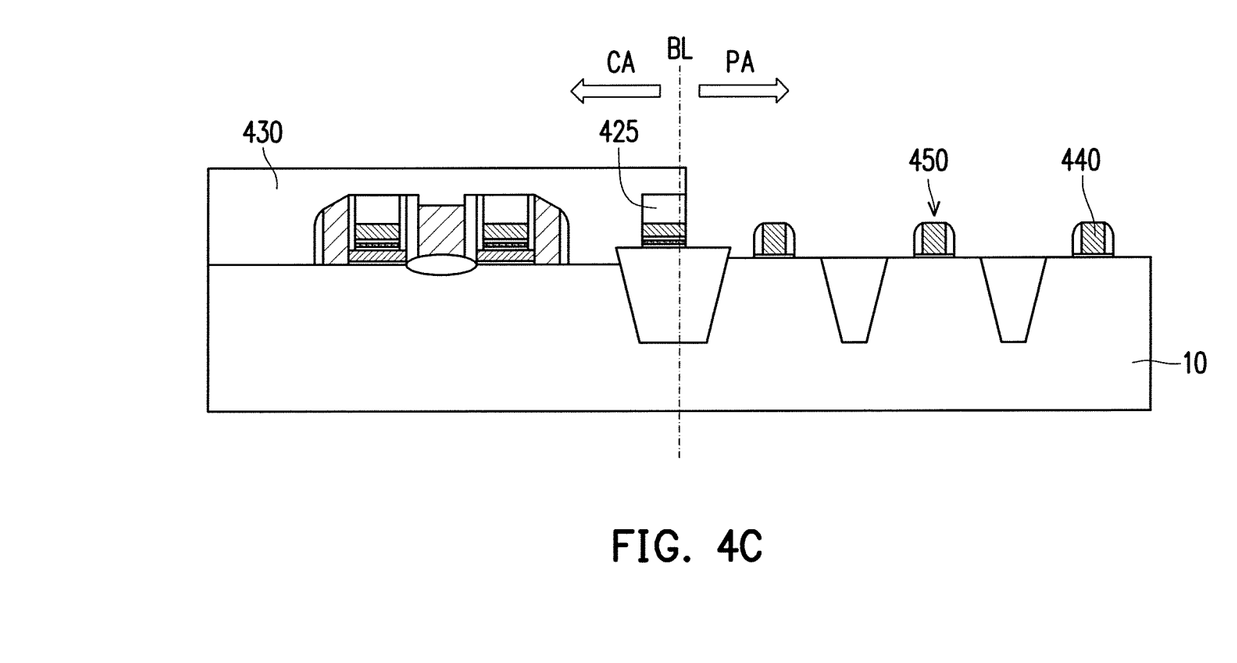

After the cover layer 430 is formed, the cover layer 430 in the peripheral area PA is removed, and all layers formed in the peripheral area PA are removed. Then, a gate insulating layer (not shown) for the FETs of the logic circuits is formed and a polysilicon layer 440 for the FETs is formed. Then, patterning operation is performed to form gate patterns for the FETs. Of course, one or more ion implantation operations and a sidewall spacer layer formation are performed during the formation of the FETs. In some embodiments, as shown in FIG. 4C, a part of the stacked layer 425 including one or more polysilicon layers and/or one or more dielectric layers remains at the boundary region.

Figure 6A:
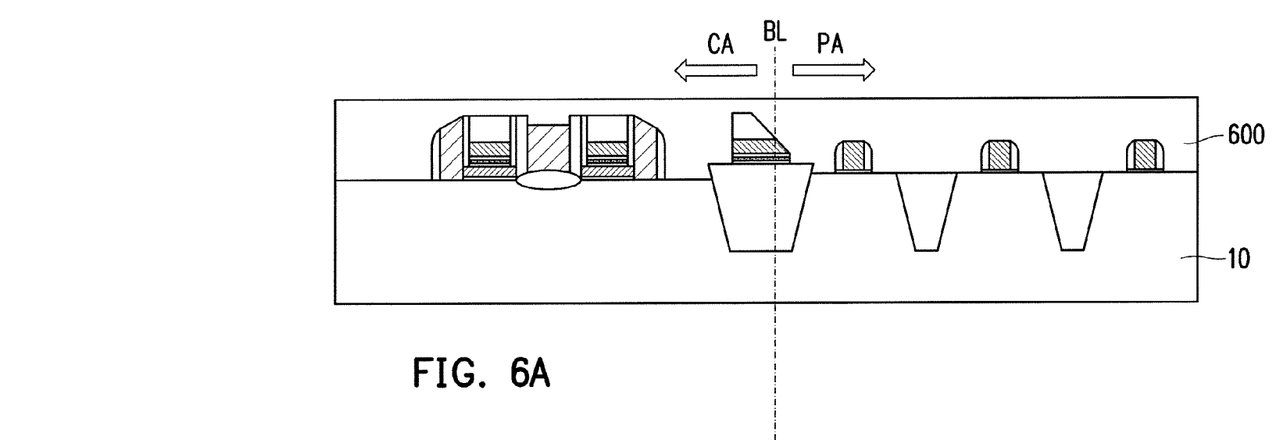

Adverting to FIG. 6A, after the gate structures 450 are formed, the cover layer 430 in the cell area CA is removed, and an interlayer dielectric (ILD) layer 600 is formed over the cell area CA and the peripheral area PA. The ILD layer 600 includes one or more layers of silicon based insulating material, such as $SiO_2$, SiN, SiOC, SiCN, SiOCN or SiON formed by CVD. The thickness of the ILD layer 600 is in a range from about 300 nm to about 1000 nm in some embodiments.

Figure 6B:
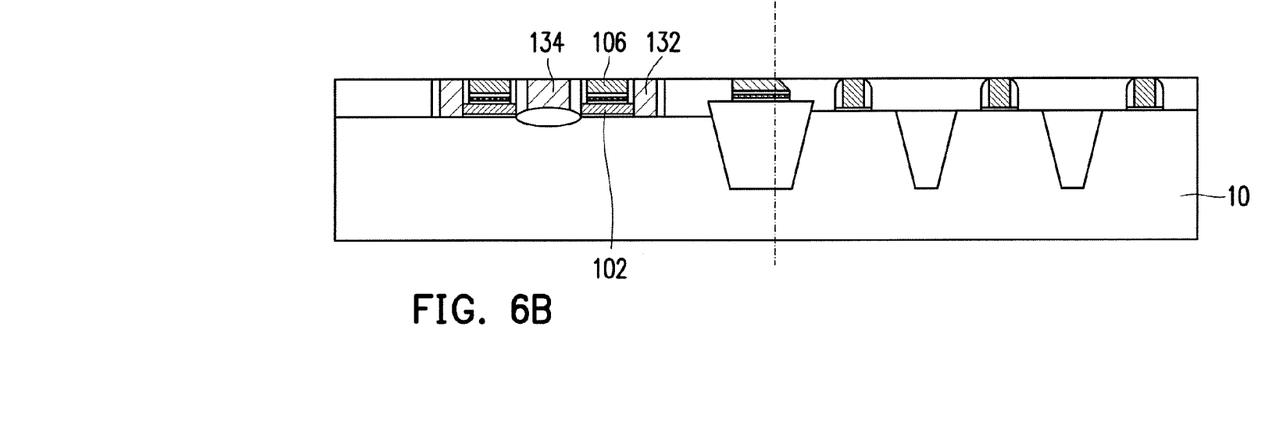

Then, as shown in FIG. 6B, the ILD 600 is planarized by CMP. In the planarization operation by CMP, the upper portions of the memory cell structures MC, including the nitride layer 108, sidewall spacers 110, 124, the word line 132 and the erase line 134, are also removed, as shown in FIG. 6B.

Since the step is formed before fabricating the memory cell structures in the cell area and the gate structures in the peripheral area, the planarization operation by CMP becomes easier than the case where no step is formed.

Figure 6C:
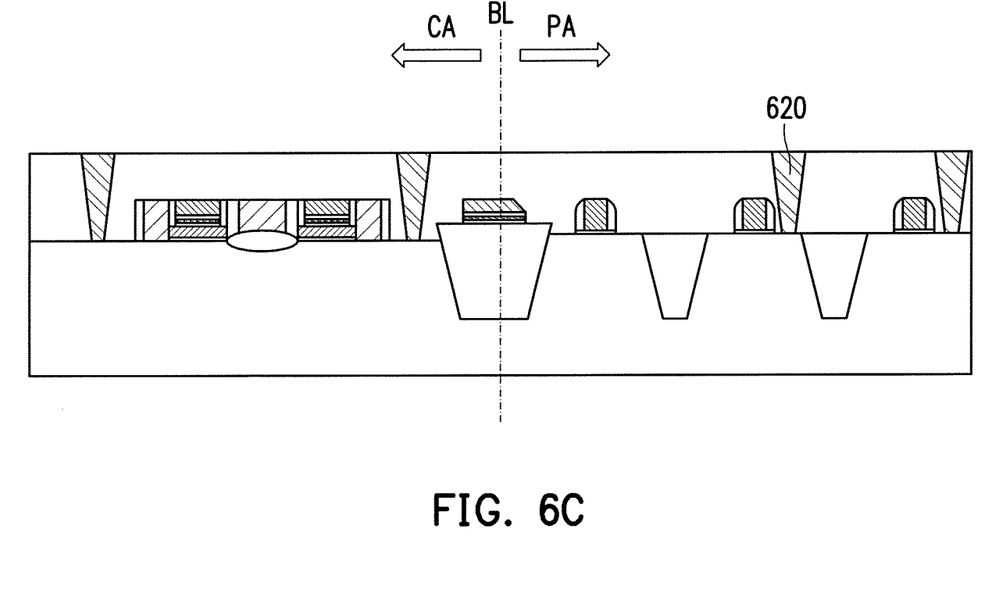

After the planarization operation, an additional ILD layer is formed and then contact structures 620 are formed as shown in FIG. 6C.

The various embodiments or examples described herein offer several advantages over the existing art.

In a comparative example, a substrate is not etched, but is directly oxidized by wet oxidation. A nitride layer formed over a pad oxide is patterned by using a resist pattern, and then the cell area is oxidized by using wet oxidation, thereby forming an oxide layer (so-called, "LOCOS"). In such a case, a large bird's beak is also formed under the nitride layer. After the wet etching of the oxide layer, the nitride layer, the pad oxide layer and the bird's beak are removed.

In this example, since the "thick" oxide layer is formed down to the target surface, the size (width) of the bird's beak becomes large. Accordingly, the width of the transition surface also becomes large, for example, more than about 500 nm.

In contrast, in the embodiments of FIGS. 2A-2D and 3A-3D, the width of the transition surface is less than about 500 nm. Accordingly, it is possible to reduce an area of the boundary region between the cell area CA and the peripheral area PA, where device placement should be avoided, can be reduced, thereby reducing an area of the semiconductor device. In some embodiments, the area of the boundary region according to the foregoing embodiments of FIGS. 2A-2D and 3A-3D can be reduced by about 5% to about 25% compared with the comparative example.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, the semiconductor device includes a non-volatile memory formed in a memory cell area and a logic circuit formed in a peripheral area. In the method, a mask layer is formed over a substrate in the memory cell area and the peripheral area. A resist mask is formed over the peripheral area. The mask layer is patterned in the memory cell area by using the resist mask as an etching mask. The substrate is etched in the memory cell area. After etching the substrate, a memory cell structure is formed in the memory cell area and a gate structure for the logic circuit is formed. A dielectric layer is formed over the memory cell structure and the gate structure. A planarization operation is performed on the dielectric layer. An upper portion of the memory cell structure is planarized during the planarization operation.

In accordance with another aspect of the present disclosure, in a method for manufacturing a semiconductor device, the semiconductor device includes a non-volatile memory formed in a memory cell area and a logic circuit formed in a peripheral area. In the method, a mask layer is formed over a substrate in the memory cell area and the peripheral area. A resist mask is formed over the peripheral area. The mask layer is patterned in the memory cell area by using the resist mask as an etching mask. The substrate is etched in the memory cell area. After the etching the substrate in the memory cell area, an oxide layer is formed by a thermal oxidation. The oxide layer and the mask layer are removed.

In accordance with another aspect of the present disclosure, a semiconductor device including a non-volatile memory formed in a memory cell area of a substrate and a logic circuit formed in a peripheral area of the substrate. A device forming surface of the substrate in the memory cell area is located at a lower level than a device forming surface of the substrate in the peripheral area. The device forming surface of the substrate in the memory cell area and the device forming surface of the substrate in the peripheral area is connected by a transition surface in which a level of a surface of the substrate changes. A width of the transition surface is in a range from 1 nm to 500 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a non-volatile memory formed in a memory cell area and a logic circuit formed in a peripheral area, the method comprising:
   forming a mask layer over a silicon substrate in the memory cell area and the peripheral area, the mask layer including a first oxide layer formed in direct contact with the substrate and a nitride layer formed on the first oxide layer;
   forming a resist mask, on the nitride layer of the mask layer, over the peripheral area;
   patterning the mask layer in the memory cell area by using the resist mask as an etching mask;
   etching an upper portion of the substrate in the memory cell area by using the patterned mask layer as an etching mask such that a step is formed in the substrate;
   after the etching the substrate, forming a second oxide layer by chemical vapor deposition over the etched substrate in the memory cell area and over the mask layer in the peripheral area
   after the forming the second oxide layer, removing the second oxide layer from the memory cell area and from the peripheral area and then removing the mask layer from the peripheral area,
   after the removing the second oxide layer and the mask layer, forming a memory cell structure in the memory cell area and forming a gate structure for the logic circuit;
   forming a dielectric layer over the memory cell structure and the gate structure; and
   performing a planarization operation on the dielectric layer, wherein:
   an upper portion of the memory cell structure is planarized during the planarization operation,
   a device forming surface of the substrate in the memory cell area is located at a lower level along a normal direction of the substrate than a device forming surface of the substrate in the peripheral area, after the etching the substrate, the device forming surface of the substrate in the memory cell area and the device forming surface of the substrate in the peripheral area is connected by a transition surface in which a level of a surface of the substrate changes, and the device forming surface in the memory cell area, the device forming surface in the peripheral area and the transition surface are a continuous silicon surface; an isolation insulating layer is disposed inside the substrate at the transition surface.

2. The method of claim 1, wherein a thickness of the second oxide layer is in a range from 0.5 nm to 5 nm.

3. The method of claim 1, wherein:
a device forming surface of the substrate in the memory cell area is located at a lower level along a normal direction of the substrate than a device forming surface of the substrate in the peripheral area, after the etching the substrate, and
a difference of a level of the device forming surface of the substrate in the memory cell area and a level of the device forming surface of the substrate in the peripheral area is in a range from 20 nm to 50 nm.

4. The method of claim 1, wherein a width of the transition surface is in a range from 1 nm to 100 nm.

5. The method of claim 1, wherein the second oxide layer is fully removed by wet etching.

6. A method of manufacturing a semiconductor device including a non-volatile memory formed in a memory cell area and a logic circuit formed in a peripheral area, the method comprising:
forming a mask layer over a silicon substrate in the memory cell area and the peripheral area, the mask layer including a first oxide layer formed in direct contact with the substrate and a nitride layer formed on the first oxide layer;
forming a resist mask, on the nitride layer of the mask layer, over the peripheral area;
patterning the mask layer in the memory cell area by using the resist mask as an etching mask;
etching an upper portion of the substrate in the memory cell area by using the patterned mask layer as an etching mask such that a step is formed in the substrate;
after the etching the substrate in the memory cell area, forming a second oxide layer by a thermal oxidation; and
removing the second oxide layer and removing the mask layer from the peripheral area, wherein:
a device forming surface of the substrate in the memory cell area is located at a lower level along the normal direction of the substrate than a device forming surface of the substrate in the peripheral area, after the removing the second oxide layer and the mask layer,
the device forming surface of the substrate in the memory cell area and the device forming surface of the substrate in the peripheral area is connected by a transition surface in which a level of a surface of the substrate changes, and
the transition surface of the substrate includes a first surface and a second surface having a different slope than the first surface, the first surface rising up from the device forming surface of the substrate in the memory cell area, and the second surface further rising up from the first surface and connected to the device forming surface of the substrate in the peripheral area.

7. The method of claim 6, further comprising, after the removing the second oxide layer and the mask layer:
forming a memory cell structure in the memory cell area and forming a gate structure for the logic circuit;
forming a dielectric layer over the memory cell structure and the gate structure; and
performing a planarization operation on the dielectric layer,
wherein an upper portion of the memory cell structure is planarized during the planarization operation.

8. The method of claim 6, wherein a thickness of the second oxide layer is in a range from 5 nm to 30 nm.

9. The method of claim 6, wherein the thermal oxidation is wet thermal oxidation.

10. The method of claim 6, wherein:
a difference of a level of the device forming surface of the substrate in the memory cell area and a level of the device forming surface of the substrate in the peripheral area is in a range from 20 nm to 50 nm.

11. The method of claim 6, wherein a width of the transition surface is in a range from 50 nm to 500 nm.

12. The method of claim 6, wherein:
a device forming surface of the substrate in the memory cell area is located at a lower level along the normal direction of the substrate than a device forming surface of the substrate in the peripheral area, after the removing the second oxide layer and the mask layer, and
after the etching the substrate in the memory cell area and before the forming the second oxide layer, a level of a surface of the substrate in the memory cell area is located between a level of the device forming surface of the substrate in the memory cell area and a level of the device forming surface of the substrate in the peripheral area after the removing the second oxide layer and the mask layer.

13. The method of claim 6, wherein the second oxide layer laterally extends under the mask layer.

14. The method of claim 6, wherein the second oxide layer is fully removed by wet etching.

15. A semiconductor device including:
a non-volatile memory formed in a memory cell area of a substrate; and
a logic circuit formed in a peripheral area of the substrate, wherein:
a device forming surface of the substrate in the memory cell area is located at a lower level than a device forming surface of the substrate in the peripheral area,
the device forming surface of the substrate in the memory cell area and the device forming surface of the substrate in the peripheral area is connected by a transition surface in which a level of a surface of the substrate changes, and
the transition surface of the substrate includes a first surface and a second surface having a different slope than the first surface, the first surface rising up from the device forming surface of the substrate in the memory cell area, and the second surface further rising up from the first surface and connected to the device forming surface of the substrate in the peripheral area.

16. The semiconductor device of claim 15, wherein a width of the transition surface is in a range from 1 nm to 500 nm.

* * * * *